United States Patent [19]

Rossman et al.

[11] Patent Number: 5,041,862
[45] Date of Patent: Aug. 20, 1991

[54] LENS SCREEN

[75] Inventors: Dieter Rossman, Aalen; Johannes Wangler, Königsbronn, both of Fed. Rep. of Germany

[73] Assignee: Carl-Zeiss-Stiftung, Heidenheim, Fed. Rep. of Germany

[21] Appl. No.: 531,778

[22] Filed: Jun. 1, 1990

[30] Foreign Application Priority Data

Jun. 5, 1989 [DE] Fed. Rep. of Germany ....... 3918293

[51] Int. Cl.[5] .................. G03B 27/00; G03B 27/44
[52] U.S. Cl. .................................... 355/1; 355/46
[58] Field of Search ............................. 355/1, 46, 50

[56] References Cited

U.S. PATENT DOCUMENTS

| | | | |
|---|---|---|---|
| 3,495,512 | 2/1970 | Vaughan | 355/46 X |
| 3,572,925 | 3/1971 | Ables | 355/46 |
| 3,580,675 | 5/1971 | Heiber et al. | |
| 3,613,532 | 10/1971 | Wildhaber | 355/1 X |
| 4,168,900 | 9/1979 | Adachi | 355/1 |
| 4,275,962 | 6/1981 | Midorikawa et al. | |
| 4,331,380 | 5/1982 | Rees et al. | 355/1 X |
| 4,417,809 | 11/1983 | Nötzel et al. | 355/46 |
| 4,462,662 | 7/1984 | Lama | 355/1 X |
| 4,550,979 | 11/1985 | Meier | |

FOREIGN PATENT DOCUMENTS 968430 9/1942 Fed. Rep. of Germany.

Primary Examiner—Richard A. Wintercorn
Attorney, Agent, or Firm—Walter Ottesen

[57] ABSTRACT

The invention is directed to a lens screen wherein lens elements are inserted into discrete openings of a carrier. The openings are defined by a plurality of interconnected struts so that a strut is disposed between each two mutually adjacent ones of the openings. The lens elements have two optically effective surfaces which are dissimilar in size and the lens elements are tapered in the region of the lens material which is not optically utilized on at least two opposite-lying faces. The struts of the carrier support the lens elements at these tapered regions and provide support from below as well as laterally. The width of the struts is dimensioned so that they do not project beyond the free space formed by the tapers. In this way, the condition is obtained that the lens elements are arranged so as to lie tightly against each other with an optically effective surface and yet receive mechanical support from the struts of the carrier.

9 Claims, 4 Drawing Sheets

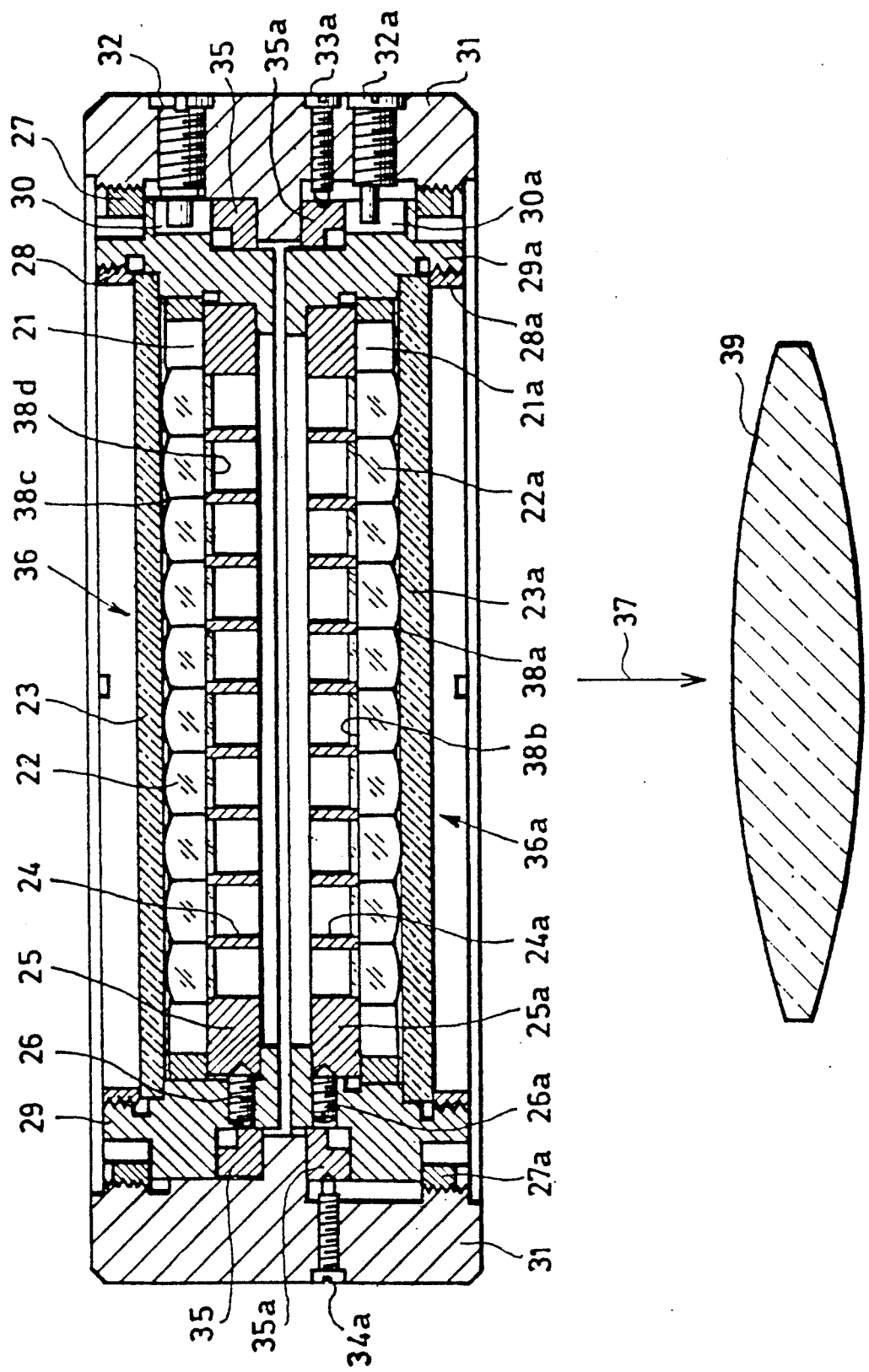

LENS SCREEN

FIELD OF THE INVENTION

The invention relates to a lens screen which includes lens elements arranged on an optical surface and having a carrier which has openings for inserting the lens elements.

BACKGROUND OF THE INVENTION

Lens screens of the type referred to above are especially used where a surface must be illuminated as homogeneously as possible.

U.S. Pat. No. 3,580,675 discloses a lens screen wherein individual lens elements are arranged along a line. No spacing is provided between the discrete lens elements which are held laterally. The two optically effective surfaces are of the same size and the lens elements are not tapered. This type of attachment does not permit a surface arrangement of the lens elements since a large space laterally of the elements is needed for securing the same.

U.S. Pat. No. 4,275,962 discloses a lens screen which is used as a lens objective. In this lens screen, maximally two rows of lens elements can be held by a carrier. A mechanical support by the carrier is not provided; instead, the individual lenses can be arranged one next to the other without an intermediate space in a maximum of two rows. In addition to the rather unstable configuration at high exploitation of the incident energy, the nature of the mounting does not permit a surface arrangement of the lens elements since the carrier projects outwardly on both sides far beyond the optical surfaces which are used.

A further lens screen is disclosed in German Patent 968,430 wherein the lens elements are mounted on a planar plate. Such lens screens are today produced by injection molding or by mounting discrete lens elements on a planar glass plate with the aid of cement, In this way, it is possible to obtain a surface arrangement of lens elements with this lens screen with the lens elements being arranged very tightly next to one another. The imprecision of the optical imaging is disadvantageous in lens screens produced with the injection molding process (wherein plastic but no glass is used as a lens material). This makes it impossible to use lens screens produced in this manner in optical precision machines. If the discrete lens elements are mounted on a glass plate with the aid of cement, no limitation as to optical quality with respect to imaging must be accepted. However, it is here disadvantageous that an absorption of radiation occurs at the glass plate and further optical junctions occur at the cement layer which is disposed in the optical beam path. The enormous complexity of cementing the many discrete lens elements is a serious limitation with respect to manufacture. Because of the cement, lens screens having lens elements cemented to a transparent base plate are not usable in all areas of application since the durability of the cement with respect to chemical influences and certain irradiation ranges is very limited with respect to time.

U.S. Pat. No. 4,550,979 discloses a vacuum-tight radiation window wherein several mutually adjacent individual lenses are held in a metal holder. A high mechanical strength is needed for use in the wall of a vacuum chamber. Furthermore, this lens screen must be cooled. This configuration of the lens elements does not permit an optimal utilization of a large area incident beam.

SUMMARY OF THE INVENTION

It is an object of the invention to provide a lens screen wherein many lens elements can be so arranged in openings of a mechanically stable carrier that the supporting parts of the carrier do not reduce the usable optical entry surfaces of the lens elements and that a free configuration of the parts of the carrier which project beyond the edge of the optical surfaces of the lens elements is possible.

According to a feature of the invention, the lens elements are arranged to lie tightly against each other with each lens element having two optically effective surfaces of different size. The lens elements are tapered at least on two mutually adjacent sides in the region of the lens material which is not utilized optically. Struts define openings of the carrier and these struts are in contact engagement with the tapered sides of the lens elements. The struts have a width corresponding to the free space between two lens elements formed by the tapers.

It is a feature of the lens screen of the invention that many discrete lens elements are placed one next to the other without a space therebetween to form a linear or surface lens screen with the lens elements being individually manufactured and selected pursuant to predetermined quality criteria. This provides a high mechanical stability of the lens screen.

The discrete lens elements are supported laterally by the carrier in that the lens elements are each received in an opening of the carrier in a mechanically stable manner. This condition notwithstanding, the carrier does not limit the optically effective surface of the discrete lens elements with any of its parts since the carrier, for providing support, utilizes the regions of the lens elements which are not optically used. In this way, a maximum exploitation of the incident energy is possible with a minimum thickness of the discrete lens elements.

A further significant advantage is then simplified assembly of the lens elements in the corresponding openings of the carrier. This assembly can be carried out much faster and with greater precision than, for example, cementing many lens elements to a planar base plate. With the lens screen according to the invention, cements that are not optically transparent can be used for attaching the lens elements to the carrier. There is also the possibility that cement can be dispensed with entirely since the lens elements can be stably fixed in a purely mechanical manner. This is especially important when using the lens screen in areas wherein chemical substances or radiation in the shortwave range can act upon the lens screen. A cement is resistant to these effects for only a limited time.

The lens elements are supported by the carrier on all sides in the lens screening according to the invention. In this way, lens elements can be mechanically supported in a stable manner which have optically sued surface diagonals which are greater than the thickness of the particular lens. The lens screen is especially advantageous in that the surface arrangement of the lens elements can define a surface screen since the carrier supports the individual lens elements at the edges of smaller optical surfaces. In this way, a mechanically stable lens screen can be assembled which has substantially less weight. This is achieved without mounting the lens elements with the aid of cement on a thick glass plate which is sensitive to shock and has an appropriate thickness corresponding to the mechanical strength required.

Notwithstanding the mechanical strength of the lens screen, a single optically effective surface of a lens screen is obtained with an appropriate configuration of the optical surfaces of the lens elements.

The lens elements must be tapered in the optical regions which are not utilized in order that the lens elements can be reliably held in the openings of the carrier. This taper can be conical or cylindrical in shape and be in the form of a step. The lens elements can be either mechanically held by the carrier or can be mounted thereon with cement in dependence upon use requirements. The use of cement to mount the lens elements on the carrier is preferred to minimize the thickness of the transparent material and therefore its absorption. In certain wavelength ranges and especially in the shortwave range, a transition to a mechanical fixation is required since the radiation can with time destroy the cement. The lens elements can then be inserted into the carrier and fixed with a thin planar plate on the carrier. This affords the advantage that no mechanical stresses are transmitted to the lens elements.

A convex lens can be mounted behind the lens screen to obtain an overlapping of the discrete beams exiting from the respective lens elements into a plane for illuminating a surface. For this purpose, it is advantageous to mount two lens screens one behind the other and to align these screens relative to each other so that the smaller optically utilized surfaces are disposed between the lens screens. In this way, a distribution of an illuminating beam into many discrete component beams is obtained without energy loss.

The lens screen of the invention is especially suitable for mounting in apparatus wherein a defined surface is to be illuminated homogeneously with the energy of the beam at a specific wavelength. This is possible because of the high transmission of the light energy with a simultaneous distribution of a light beam in several discrete light beams which are variable with respect to their form. Because of the above, the installation of a lens screen of the kind described above in a wafer stepper is advantageous when the lens screen defines part of the condenser of the illuminating optics.

BRIEF DESCRIPTION OF THE DRAWINGS

The invention will now be described with reference to the drawings wherein:

FIG. 5 is a side elevation view, partially in section, showing a double lens screen arrangement.

DESCRIPTION OF THE PREFERRED EMBODIMENTS OF THE INVENTION

Figure 1:
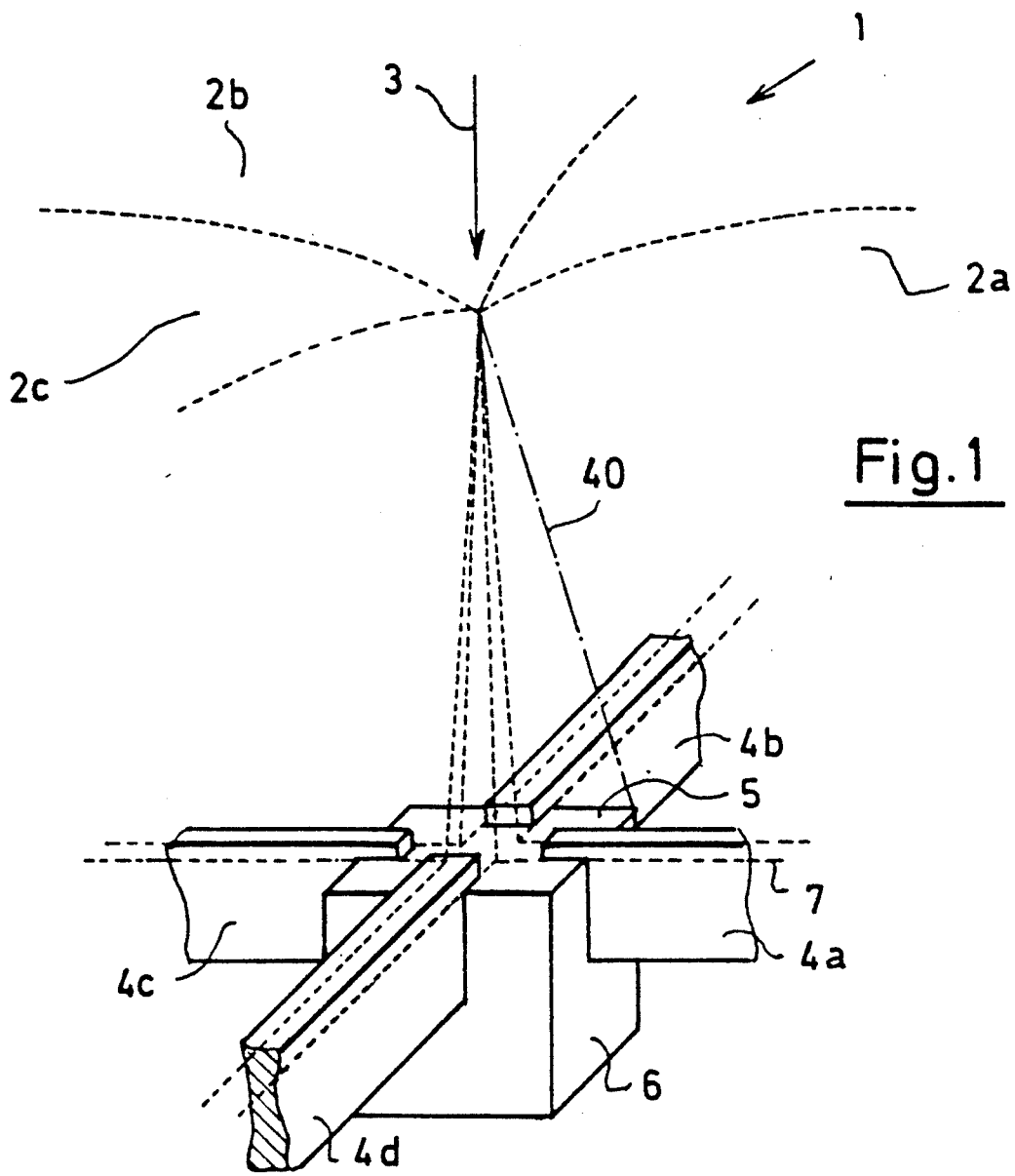
FIG. 1 is a three-dimensional perspective view at the interface point of several lens elements and also shows the carrier and its struts for fixing the lens elements.

Referring to FIG. 1, four schematically represented lens elements (2a to 2d) are shown meeting with respective corners at one point of the lens screen with each of the lens elements having rectangularly-shaped optically effective surfaces. The lens elements (2a to 2d) lie tightly one next to the other at the edges of their larger optical faces and form a single beam entry surface for the lens screen 1 viewed in the direction of the optical axis 3. The lens elements (2a and 2d) taper conically from the upper optically-effective surface to the lower optically-effective surface. In this way, a free space which becomes wider in the downward direction is formed between the lens elements (2a to 2d).

In the lower region of the free space, struts (4a to 4d) of the carrier extend with their upper region 7 into this free space and provide lateral support to the lens elements (2a to 2d). The lens elements (2a to 2d) are provided with support from below by a holder piece 6 on which the lens elements lie with their corners 5. The struts (4a to 4d) are inserted into the holder piece 6 and are rigidly connected therewith. A ray 40 is shown to identify the optically utilized regions of the lens elements (2a to 2d).

Figure 1A:
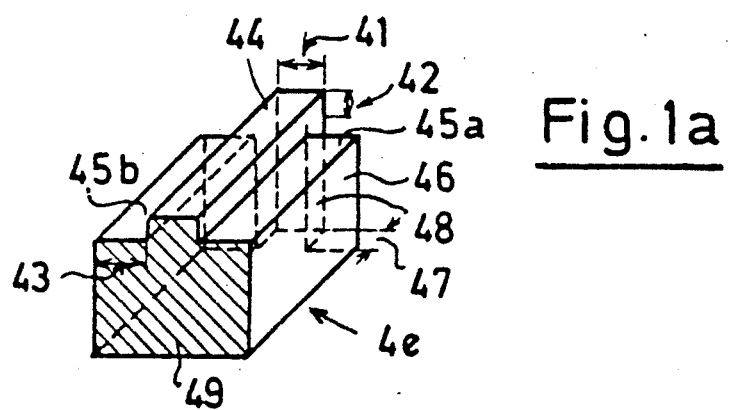
FIG. 1a shows an alternate embodiment of a strut which includes supporting shoulders.

A modified strut 4e is shown in FIG. 1a and can be utilized in lieu of the struts (4a to 4d) shown in FIG. 1. This strut 4e provides not only lateral support for the lens elements (2a to 2d in FIG. 1) in the manner of struts (4a to 4d) of FIG. 1 but also provides the lens elements (2a to 2d in FIG. 1) with a supporting surface (45a, 45b) between two holding bodies along their lateral lower boundary edges.

The strut 4e comprises a base body 49 on which a riser 44 is provided on its upper surface. This riser 44 partitions the top surface into three regions. The lens elements (2a to 2d) are provided with supporting surfaces on the lateral faces (45a, 45b) of the strut 4e. The width 43 of the two supporting surfaces results as the difference between the lower optically effective surfaces of two mutually adjacent lens elements less the width 41 of the riser 44. In this way, the lens elements (2a to 2d of FIg. 1) can be reliably supported by the strut 4e without their optical function being limited since the strut 4e does not limit the optically used surfaces of the mounted lens elements.

The riser disposed on the base body 49 is configured as an insert riser 48 centered at the end of the base body 49. The width 41 of the riser 44 as well as its elevation 42 are so dimensioned that the riser 44 projects unhindered into the lower free space between the two mutually adjacent lens elements (2a and 2d). With the insert riser 48, the strut 4e engages into a holding piece 6 with the entire length 47 of the insert riser 48 and is braced by the holding piece 6 as well as being held laterally thereby. The attachment of the strut 4e in the holding piece 6 can be achieved with cement or a mechanical attachment (threaded fasteners, wedges and the like).

If the lateral support of the lens elements by means of the riser 44 of the strut 4e is inadequate, then the lens elements can be provided with a further lateral support in that the riser 44 of the strut 4e is configured in correspondence to the taper of the lens elements. If the constructive configuration of the lens elements permit, the lens elements themselves can also be provided with a step in the lower portion of the conical side surfaces so that the lens elements are not only supported at the riser 44 of the strut 4e but also on the lateral boundary surfaces 46 thereof.

Figure 2:
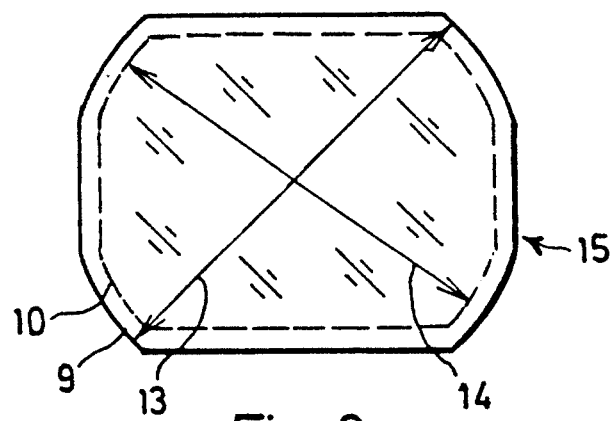
FIG. 2 is a plan view of a discrete lens element.

FIG. 2 shows a plan view of a lens element 15 which is suitable for illuminating a rectangular surface having rounded edges. The lens element 15 has a large upper optically effective surface (solid boundary line 9) having a surface diagonal 13 greater than the surface diagonal 14 of the smaller lower optically effective surface (broken inner boundary line 10). The boundary lines (9, 10) of both optically effective surface delimit the space which is maximally provided as a supporting surface for the strut of a carrier at the smaller optically effective surface. A free space is provided at the sides of the lens element 15 because the lens element 15 has a conical form which tapers starting from the larger optically effective surface 9 toward the smaller optically effective surface 10. The size of this free space is fixed by the incoming radiation as well as by the configuration of the optically effective surfaces.

Side elevation views of several embodiments of lens element 15 of FIG. 2 are shown in FIGS. 2a and 2b and FIGS. 2c and 2d. In these embodiments, the configuration of the two optically effective surfaces are considered only exemplary.

Figure 2A:
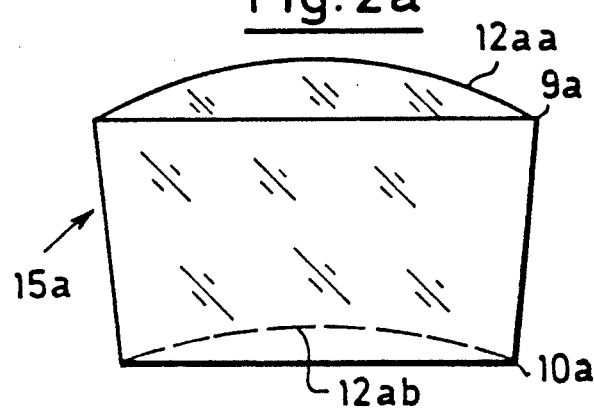
FIG. 2a is a side elevation view of the lens element of FIG. 2 wherein the lens element is provided with conical side surfaces.
Figure 2B:
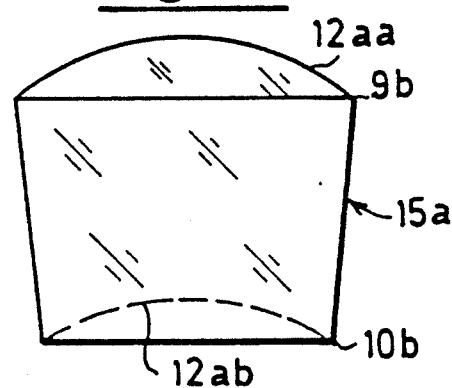
FIG. 2b is a side elevation view of the lens element of FIG. 2 wherein the lens element is viewed at its shorter side.
Figure 2C:
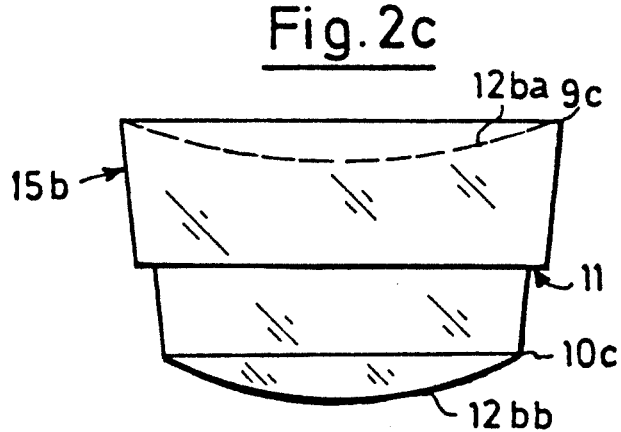
FIG. 2c is a side elevation view of the lens element of FIG. 2 provided with conical side faces which include a step.
Figure 2D:
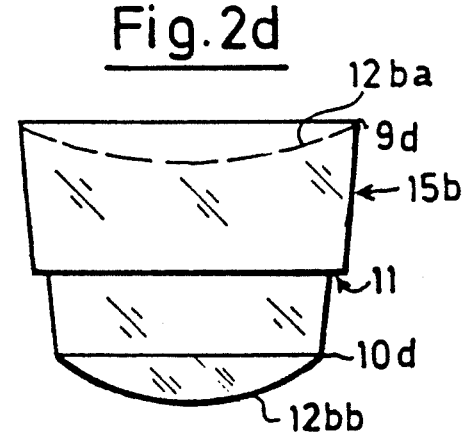
FIG. 2d is a side elevation view of the lens element of FIG. 2 viewed from the shorter side and wherein the side surfaces are conical and include a step.

The lens element 15a in FIGS. 2a and 2b has a larger optically effective convex surface 12a and smaller optically effective concave surface 12ab. The sides of the lens element 15a taper continuously starting from the boundary line (9a, 9b) of the larger upper optically effective surface 12aa down to the smaller lower optically effective surface 12ab so that the lens element 15a has conically angled sides viewed in the direction of the optical axis. In this way, a triangularly-shaped free space is provided between two mutually adjacent lens elements in which a riser of a strut can engage for a lateral fixation of the lens element 15a. The constructive configuration of this lens element 15a permits the lateral support as well as the support from below at the lateral boundary faces of the lens element 15a. The struts of a carrier have to be exactly adapted in their form to the lateral boundary faces of the lens elements 15a since only these boundary faces are available for fixing a lens element on the struts of a carrier and the struts are disposed entirely in the free space defined by the conical side faces of the lens elements 15a. This requires a very precise manufacture of the struts of the carrier which can lead to problems because of the angled sides of the struts. Struts having contact faces which run perpendicular to the particular lens elements are easier to produce. These manufacturing preconditions are considered in the side elevation view of another lens element 15b shown in FIGS. 2c and 2d with the plan view of the lens element 15 corresponding to that shown in FIG. 1.

The lens element 15b has a larger upper optically effective concave surface 12ba and a smaller lower optically effective convex surface 12bb. The lens element 15b tapers with a discontinuity along its side starting from the upper boundary line (9c, 9d) of the larger optically effective surface topward the lower boundary line (10c, 10d) of the smaller optically effective surface. The lens element 15b tapers only slightly conically in the upper portion thereof. A step 11 is provided in the lower portion. Beneath the step 11, the two lateral faces again extend slightly conically so that the lens element 15b when viewed in its entirety is tapered cylindrically in the region which is not utilized optically. The slightly conical form of the lateral lower and upper faces of the lens element 15b facilitates the seating of the lens element 15b in the openings of the carrier. In principle, the side faces can also extend parallel to each other.

The lens element 15b seats on the struts of the carrier of the lens with the step 11 whereby a reliable lower support as well as a lateral support with fewer problems is provided for the lens element 15b. The maximum size of the step is determined from the following: the ratio of the smaller to the larger optically effective surface, incident radiation specific to the apparatus and the slope gradient of the lateral boundary faces. For lens elements which are seated in an appropriate manner in the lens screen, there is always the possibility to machine the step 11 from the material of the lens element 15b itself since the choice of the configuration of the transition from the larger to the lower optically effective surface is relatively free.

Figure 3:
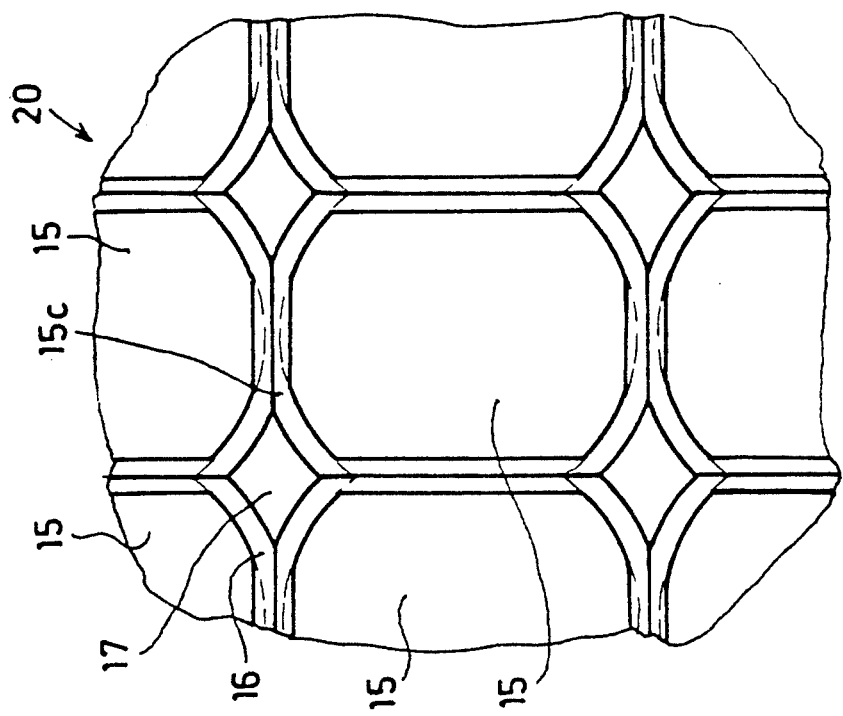
FIG. 3 shows an enlarged broken-out detailed portion of the lens screen of FIG. 4.
Figure 4:
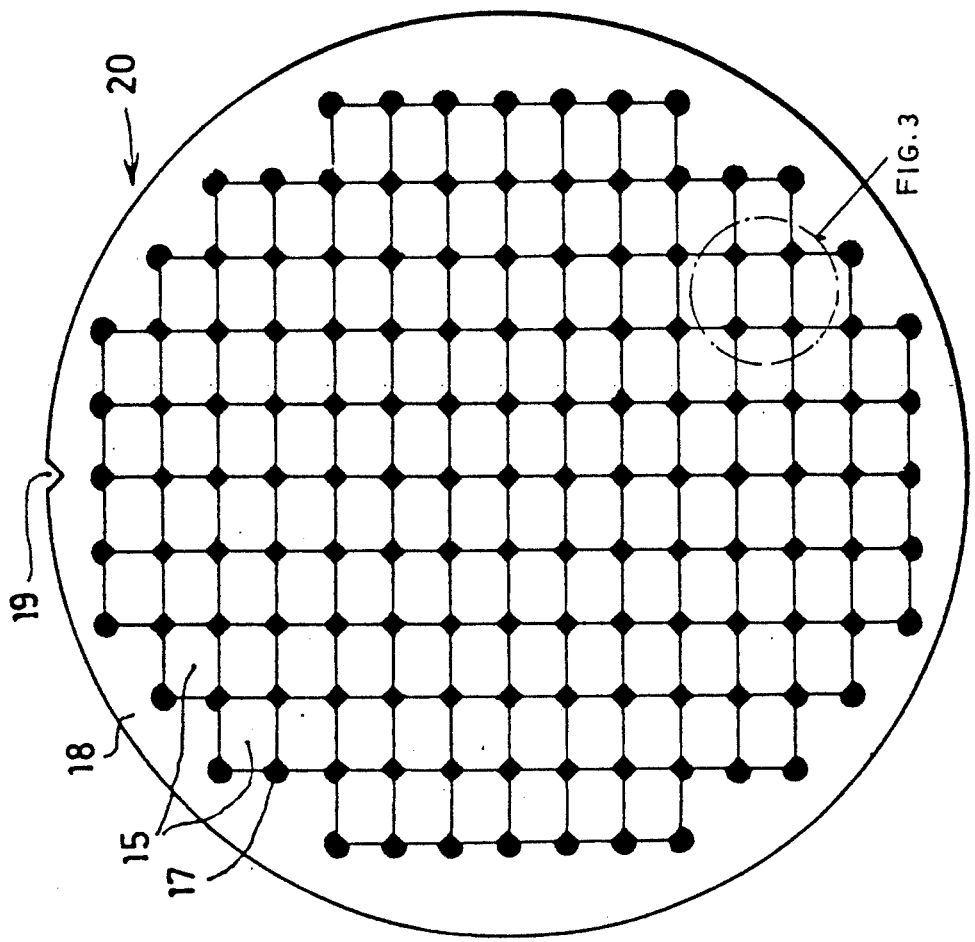
FIG. 4 is a plan view of a lens screen according to the invention.

FIG. 3 is an enlarged detail view showing a portion of the lens screen 20 in FIG. 4. The lens elements 15 are seated in the openings of the carrier with the openings being delimited by the struts 16. The discrete lens elements lie tightly one next to the other with their optically effective larger surfaces. The lens elements 15 have two dissimilarly large optically effective surfaces and taper starting from the upper optically effective surface down toward the lower optically effective surface at all four sides of the rectangularly-shaped lens element 15.

The struts 16 impart a reliable support to the lens elements 15 in the free space formed between each two lens elements 15. The struts 16 are in contact engagement only with the tapered faces of the lens elements 15 and do not project out of the free space between the lens elements 15. This free space is formed by the taper of the lens elements 15. The form of the optically-effective surfaces of the lens elements 15 is determined by the form of the surface to be homogeneously illuminated. This surface is rectangularly shaped and has rounded edges. The upper optically effective surfaces of the lens elements 15 project over the struts 16 of the carrier of the lens screen 20 because of their form.

The geometric form of the optically effective surfaces of the lens elements 15 causes free spaces to be formed at their corners between the lens elements. The holding pieces 17 are accommodated in these free spaces and define the connecting points of the struts 16.

FIG. 4 is a plan view of the entire lens screen 20. The lens elements 15 are uniformly distributed over the lens screen 20 so that a maximum exploitation of the surfaces is provided (maximum packaging density). Energy losses occur at the holding bodies only because of the corners of the lens elements 15 which are rounded in correspondence to the optical surface to be illuminated. The arrangement of the lens elements 15 is surrounded from the outside by a stable supporting ring 18 in order to impart adequate mechanical strength to the lens screen 20. This holding ring 18, the struts 16 (FIG. 3) and the holding pieces 17 defining the connecting points of the struts are all made of a material having a coefficient of expansion which is as close as possible to the coefficient of expansion of the lens elements 15 and such a material can, for example, by Invar notch 19 is provided in the outer supporting ring 18 of the lens screen 20 to ensure that the lens screen is correctly mounted in its holder and to assure that the lens screen 20 has a specific orientation when mounting in the holder.

FIG. 5 shows two lens screens (36, 36a) built into a holder 31. The lens elements (22, 22a) of both lens screens (36, 36a) are so aligned to each other that each lens element 22 of the one lens screen 36 precisely images the parallel rays of a beam source precisely on a corresponding lens element 22a of the other lens screen 36a without shading. In order to be able to provide this alignment of the two lens screens (36, 36a) precisely to each other, the holder 31 of the lens screens (36, 36a) is provided with elements which permit the two lens screens (36, 36a) to be moved and fixed relative to each other.

The lens elements (22, 22a) have a slightly conical form in the upper region and a step in the lower region. The lens elements 22, 22a project into the free space of the lens screen (26, 36a) with the tapered portion extending beyond the step. These free spaces are delimited by the struts (24, 24a), which are disposed within the outer supporting ring (25, 25a) which stabilize the struts. The lens elements (22, 22a) are seated firmly on the struts (24, 24a) with their steps sot hat the lens elements are provided with a firm support from below as well as at both faces. The lateral support of the lens elements (22, 22a) is supported by an outer fill body (21, 21a) disposed between the outer lens elements (22, 22a) and the inner movable carrier (29, 29a) of the holder 31.

Spacer rings (35, 35a) between holder 31 and carriers (20, 29a) assure that the correct spacing is provided between the lens screens (36, 36a).

Each lens screen (36, 36a) is fixed in its carrier (29, 29a) by headless fixing screws (26, 26a). A glass plate (23, 23a) above the lens screen (36, 36a) assures that the lens elements (22, 22a) do not fall out of the lens screen since the lens elements (22, 22a) are not cemented to the struts of the lens screen (36, 36a). If the lens elements (22, 22a) are cemented to the struts of the lens screens, then the glass plates (23, 23a) are not needed. If, however, environmental conditions (radiation, chemical substances and the like) lead to a destruction of the cement layer, then the glass plates (23, 23a) provide a reliable support for the lens elements (22, 22a) in the lens screens (36, 36a). The glass plates (23, 23a) are fixed to the lens screens (36, 36a) in the carriers (29, 29a) by the clamping rings (28, 28a).

The spacer rings (35, 35a) are fixed in the holder 31 by means of clamping screws and in FIG. 5, only the clamping screws (33a, 34a) for spacer ring 35a are shown. Furthermore, the lens screen 36a can be displaced in the plane perpendicular to the optical axis 37 within a certain range for compensating for manufacturing tolerances. This displacement can be achieved with the clamping screws (33a, 34a).

The two lens screens (36, 36a) can be rotated perpendicular to the optical axis 37 with the adjusting screws (32, 32a). For this purpose, the adjusting screws (32, 32a) have an off-axis extension at their ends. This off-axis extension is disposed in an opening (30, 30a) of the carrier (29, 29a) and provides that the lens screens (36, 36a) can make a right-hand or left-hand rotation within a narrow angular range. If the two lens screens (36, 36a) are precisely aligned with respect to each other, then this alignment can be fixed by means of a clamping ring (27, 27a) for each carrier (29, 29a). A holder 31 of this kind having two lens screens (36, 36a) is suitable for use in a condenser of an illuminating optic of a wafer stepper with a large lens 39 being disposed behind the two lens screens (36, 36a) to assure that the beams generated by the lens screens (36, 36a) overlap in a plane for illuminating an artwork.

Instead of placing the glass plates (23, 23a) directly on the lens elements (22, 22a), smaller spacer elements can be applied to the glass plates (23, 23a) which fix the individual lens elements (22, 22a) at their corner points in the lens screen (36, 36a).

It is understood that the foregoing description is that of the preferred embodiments of the invention and that various changes and modifications may be made thereto without departing from the spirit and scope of the invention as defined in the appended claims.

What is claimed is:

1. A lens screen defining an optical axis, the lens screen comprising:

a carrier having a plurality of interconnected struts defining a plurality of openings;

a plurality of lens elements insertably seated in corresponding ones of said openings;

each of said lens elements including: a lens body; an optically effective first surface defining a first end of said body; an optically effective second surface defining a second end of said body; and, said first surface being larger than said second surface;

the body of each of said lens elements having at least two optically unused tapered side faces extending between said ends;

each two mutually adjacent ones of said elements having respective tapered side faces directly opposite each other to conjointly define a free space between said two mutually adjacent elements, said free space having a space width determined by the tapers of said side faces;

one of said struts being disposed in said free space so as to lie in supporting contact engagement with said tapered side faces; and, said strut having a strut width which does not exceed the space width of said free space.

2. The lens screen of claim 1, said lens body having a thickness measured in the direction of said axis; and, said first surface and said second surface having respective surface diagonals each greater than said thickness.

3. The lens screen of claim 1, said lens elements being mounted in a single plane so as to cause the respective first surfaces thereof to by mutually contiguous so as to conjointly define a single beam entry surface extending transversely to said axis.

4. The lens screen of claim 1, said tapered side faces being conically tapered.

5. The lens screen of claim 1, said tapered side faces being cylindrically tapered.

6. The lens screen of claim 1, comprising a transparent planar plate; and, holding means for holding said planar plate ahead of said lens elements.

7. The lens screen of claim 1, comprising cement means for cementing said lens elements onto said struts on said carrier.

8. A lens screen assembly defining an optical axis, the lens screen assembly comprising:

a first lens screen unit including: a first carrier having a plurality of interconnected struts defining a plurality of openings; a first plurality of lens elements insertably seated in corresponding ones of said openings; each of said lens elements including: a lens body; an optically effective first surface defining a first end of said body; an optically effective second surface defining a second end of said body;

and, said first surface being larger than said second surface; the body of each of said lens elements having at least two optically unused tapered side faces extending between said ends; each two mutually adjacent ones of said elements having respective tapered side faces directly opposite each other to conjointly define a free space between said two mutually adjacent elements, said free space having a space width determined by the tapers of said side faces; one of said struts being disposed in said free space so as to lie in supporting contact engagement with said tapered side faces; and, said strut having a strut width which does not exceed the space width of said free space;

a second lens screen unit disposed directly adjacent said first lens screen unit, said second lens screen unit including: a second carrier having a plurality of interconnected second struts defining a plurality of openings; a plurality of second lens elements; each of said second lens elements including: a second lens body; an optically effective first surface defining a first end of said second lens body; an optically effective second surface defining a second end of said second lens body; and, said first surface of said second lens body being larger than said second surface of said second lens body; said second lens elements being insertably seated in corresponding ones of the openings of said second carrier so as to cause the second surfaces of said second lens elements to be disposed directly opposite and facing the second surfaces of the lens elements of said first plurality of lens elements; said second lens body having at least two optically unused tapered side faces extending between said ends of said second lens body; each two mutually adjacent ones of said second lens elements having respective tapered side faces directly opposite each other to conjointly define a second free space between said two mutually adjacent ones of said second lens elements, said second free space having a space width determined by the tapers of said last-mentioned side faces; one of said second struts being disposed in said second free space so as to lie in supporting contact engagement with said last-mentioned tapered side faces; and said second strut having a strut width which does not exceed the space width of said second free space;

holding means for holding said first and second lens screen units in a fixed spaced relationship to each other; and, alignment means for fixedly aligning the lens elements of said first lens screen relative to the lens elements of said second lens screen.

9. The lens screen assembly of claim 8, further comprising a convex lens disposed downstream of said first and second lens screen units.

* * * * *

UNITED STATES PATENT AND TRADEMARK OFFICE
CERTIFICATE OF CORRECTION

PATENT NO. : 5,041,862

DATED : August 20, 1991

INVENTOR(S) : Dieter Rossmann and Johannes Wangler

It is certified that error appears in the above-identified patent and that said Letters Patent is hereby corrected as shown below:

On the title page, under "Inventors": delete "Dieter Rossman" and substitute -- Dieter Rossmann -- therefor.

In column 1, line 38: delete "," and substitute -- . -- therefor.

In column 2, line 39: delete "then" and substitute -- the -- therefor.

In column 2, line 55: delete "screening" and substitute -- screen -- therefor.

In column 2, line 57: delete "sued" and substitute -- used -- therefor.

In column 4, line 2, after "and", add -- , --.

In column 4, line 10, after "screen", add -- 1 --.

In column 4, line 16: delete "and" and substitute -- to -- therefor.

In column 4, line 48: delete "FIg." and substitute -- FIG. -- therefor.

In column 5, line 1: delete "permit" and substitute -- permits -- therefor.

UNITED STATES PATENT AND TRADEMARK OFFICE
CERTIFICATE OF CORRECTION

PATENT NO. : 5,041,862

DATED : August 20, 1992

INVENTOR(S) : Dieter Rossmann and Johannes Wangler

It is certified that error appears in the above-identified patent and that said Letters Patent is hereby corrected as shown below:

In column 5, line 14: delete "surface" and substitute -- surfaces -- therefor.

In column 5, line 30: delete "12a" and substitute -- 12aa -- therefor.

In column 5, line 55: delete "view" and substitute -- views -- therefor.

In column 6, line 8, between "lens" and "with", insert -- screen --.

In column 6, line 22: delete "in" and substitute -- of -- therefor.

In column 6, line 66: delete "by" and substitute -- be -- therefor.

In column 6, line 66, between "Invar" and "notch", insert -- . A --.

In column 7, line 17, between "elements" and "22", insert -- ( --.

In column 7, line 18: delete "26" and substitute -- 36 -- therefor.

UNITED STATES PATENT AND TRADEMARK OFFICE
CERTIFICATE OF CORRECTION

PATENT NO. : 5,041,862

DATED : August 20, 1992

INVENTOR(S) : Dieter Rossmann and Johannes Wangler

It is certified that error appears in the above-identified patent and that said Letters Patent is hereby corrected as shown below:

In column 7, line 23: delete "sot hat" and substitute -- so that -- therefor.

In column 7, line 30: delete "20" and substitute -- 29 -- therefor.

In column 8, line 5: delete "smaller" and substitute -- small -- therefor.

In column 8, line 58: delete "on" and substitute -- of -- therefor.

In column 10, line 17: after "and", insert -- , --.

Signed and Sealed this

Eleventh Day of May, 1993

Attest:

MICHAEL K. KIRK

Attesting Officer    Acting Commissioner of Patents and Trademarks